(12) United States Patent  (10) Patent No.: US 8,705,238 B2
Nakashiba et al.  (45) Date of Patent: Apr. 22, 2014

(54) EXTERNAL STORAGE DEVICE AND METHOD OF MANUFACTURING EXTERNAL STORAGE DEVICE

(75) Inventors: Yasutaka Nakashiba, Kanagawa (JP); Kenta Ogawa, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 360 days.

(21) Appl. No.: 12/926,710

(22) Filed: Dec. 6, 2010

(65) Prior Publication Data
US 2011/0141681 A1  Jun. 16, 2011

(30) Foreign Application Priority Data

Dec. 15, 2009  (JP) ................................ 2009-284348

(51) Int. Cl.
H05K 7/20 (2006.01)
H01L 23/48 (2006.01)
H01F 7/06 (2006.01)

(52) U.S. Cl.
USPC ........... 361/715; 361/671; 257/691; 29/602.1

(58) Field of Classification Search
USPC ............ 361/671, 761, 760, 679.31, 752, 730, 361/737; 257/691, 692, 724, E21.499; 174/520, 521
See application file for complete search history.

(56) References Cited

U.S. PATENT DOCUMENTS

| | | | | |
|---|---|---|---|---|
| 5,952,040 A * | 9/1999 | Yadav et al. | ................ | 427/126.3 |
| 6,410,355 B1 * | 6/2002 | Wallace | ......................... | 438/15 |
| 6,580,620 B1 * | 6/2003 | Kim | ............................. | 361/784 |
| 6,639,309 B2 * | 10/2003 | Wallace | ........................ | 257/678 |
| 6,665,201 B1 * | 12/2003 | Spencer et al. | ................... | 365/1 |
| 6,854,984 B1 * | 2/2005 | Lee et al. | ......................... | 439/79 |
| 7,476,105 B2 * | 1/2009 | Ni et al. | .......................... | 439/66 |
| 7,535,719 B2 * | 5/2009 | Hiew et al. | .................... | 361/737 |
| 7,768,110 B2 * | 8/2010 | Nishizawa et al. | ........... | 257/679 |
| 2004/0066693 A1 * | 4/2004 | Osako et al. | .................. | 365/222 |
| 2007/0096284 A1 * | 5/2007 | Wallace | ........................ | 257/686 |
| 2008/0094807 A1 * | 4/2008 | Hiew et al. | .................... | 361/737 |
| 2008/0173995 A1 | 7/2008 | Kuratomi et al. | | |
| 2009/0200985 A1 * | 8/2009 | Zane et al. | .................... | 320/108 |

(Continued)

FOREIGN PATENT DOCUMENTS

JP  4-167719 A  6/1992
JP  8-195579 A  7/1996

(Continued)

OTHER PUBLICATIONS

Translation of JP08195579.*

(Continued)

*Primary Examiner* — Adrian S Wilson
*Assistant Examiner* — Abhishek Rathod
(74) *Attorney, Agent, or Firm* — McGinn IP Law Group, PLLC

(57) ABSTRACT

A storage element is provided in a semiconductor chip, and an inductor and a driver circuit are provided in another semiconductor chip. An external terminal is a contact type terminal, and at least some external terminals are a power supply terminal and a ground terminal. A sealing resin layer is formed over a first surface of an interconnect substrate and seals the semiconductor chips but does not cover the external terminal. The inductor is formed at a surface of the semiconductor chip not facing the interconnect substrate.

19 Claims, 16 Drawing Sheets

(56) References Cited

U.S. PATENT DOCUMENTS

| | | | |
|---|---|---|---|
| 2010/0124010 A1* | 5/2010 | Shiu et al. | 361/679.31 |
| 2010/0237462 A1* | 9/2010 | Beker et al. | 257/531 |
| 2011/0012228 A1* | 1/2011 | Nakagawa et al. | 257/531 |
| 2011/0049693 A1* | 3/2011 | Nakashiba et al. | 257/676 |
| 2011/0143662 A1* | 6/2011 | Nakashiba et al. | 455/41.1 |
| 2011/0241165 A1* | 10/2011 | Nakashiba et al. | 257/531 |

FOREIGN PATENT DOCUMENTS

| | | |
|---|---|---|
| JP | 8-204292 A | 8/1996 |
| JP | 2002-83894 A | 3/2002 |
| JP | 2003-36427 A | 2/2003 |
| JP | 2004-295172 A | 10/2004 |
| JP | 2006-108496 A | 4/2006 |
| JP | 2007-133630 A | 5/2007 |
| JP | 2007-213212 A | 8/2007 |
| JP | 2008-84263 A | 4/2008 |
| JP | 2009-105126 A | 5/2009 |

OTHER PUBLICATIONS

Translation of JP2004295172.*
Translation of JP2006108496.*
Translation of JP2007133630.*
Notice of Reasons for Rejection, dated Apr. 2, 2013 with English translation.
Japanese Notice of Reasons for Rejection, dated Dec. 3, 2013 with English translation.

* cited by examiner

EXTERNAL STORAGE DEVICE AND METHOD OF MANUFACTURING EXTERNAL STORAGE DEVICE

This application is based on Japanese patent application NO. 2009-284348, the content of which is incorporated hereinto by reference.

BACKGROUND

1. Technical Field

The present invention relates to an external storage device with a high tamper-proof property and a method of manufacturing an external storage device.

2. Related Art

In the business of making money by selling content, an external storage device in which the content is stored, for example, a memory card may be sold. In such a business model, the content stored in an external storage device is increasingly read by a dedicated device in recent years. When the external storage device is formed by a typical memory card, the information is transmitted to the dedicated device using a contact type external terminal (for example, see Japanese Unexamined patent publication NO. 2009-105126).

In addition, Japanese Unexamined patent publication NO. 2002-083894 discloses performing non-contact type transmission of the information to the outside by providing an antenna coil in a semiconductor chip.

In the business of making money by selling content, it is important to suppress illegal duplication of the content, that is, to improve the tamper-proof property. A general method for improving the tamper-proof property depends on software processing, such as encryption of the content. However, even if the tamper-proof property is ensured by software processing, it becomes possible to read the contents if software which lowers the tamper-proof property, such as decryption software, is created. Thus, it has been difficult to sufficiently ensure the tamper-proof property.

SUMMARY

The inventor has made the present invention noting that when the content cannot be used if the content is not read by a dedicated device, the tamper-proof property can be ensured by making it impossible to form an external storage device with general products even if the content is read and copied.

In one embodiment, there is provided an external storage device including: an interconnect substrate; at least one semiconductor chip disposed over a first surface of the interconnect substrate; a storage element provided in at least the one semiconductor chip; an inductor which is provided in at least the one semiconductor chip and which communicates information stored in the storage element to the outside; a driver circuit which is provided in at least the one semiconductor chip in order to drive the inductor; a contact type external terminal provided in the interconnect substrate; and a sealing resin layer which is formed over the first surface of the interconnect substrate and which seals at least the one semiconductor chip and does not cover the external terminal. The inductor is formed at a surface of the semiconductor chip not facing the interconnect substrate.

When the content is stored in the external storage device according to the embodiment of the present invention and is read by a dedicated device, it is necessary to manufacture an external storage device with the same structure as an imitation product of the external storage device according to the embodiment of the present invention in order to use the duplicated content. In the present invention, the information stored in the storage element is communicated to the outside through the inductor. The inductor is small because the inductor is formed in a semiconductor chip. In other words, it is difficult to form an inductor, which has the same diameter as the inductor in the embodiment of the present invention, without using a semiconductor process. In order to realize a semiconductor process, a large investment in facilities is required. Accordingly, it is difficult to manufacture imitation products of the semiconductor chip in terms of costs. For this reason, according to the embodiment of the present invention, even if the content stored in the external storage device can be read, it is not possible for those who copy the content to prepare an external storage device for storing the content. As a result, the tamper-proof property is improved.

In addition, a communicable range of the inductor becomes short as the diameter of the inductor decreases. On the other hand, in the present invention, the distance from the inductor to the outside surface of the external storage device becomes short since at least one semiconductor chip described above is simultaneously sealed by the sealing resin layer. Accordingly, even if the communicable range of the inductor becomes short, a receiver can be located in the communicable range.

In another embodiment, there is provided a method of manufacturing an external storage device including: disposing at least one semiconductor chip over a first surface of an interconnect substrate having a contact type external terminal; and forming a sealing resin layer over the first surface of the interconnect substrate such that at least the one semiconductor chip is sealed and the external terminal is not covered. A storage element is provided in at least the one semiconductor chip. An inductor which communicates information stored in the storage element to the outside is provided in at least the one semiconductor chip. A driver circuit of the inductor is provided in at least the one semiconductor chip.

According to the embodiments of the present invention, a tamper-proof property of an external storage device can be sufficiently ensured.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
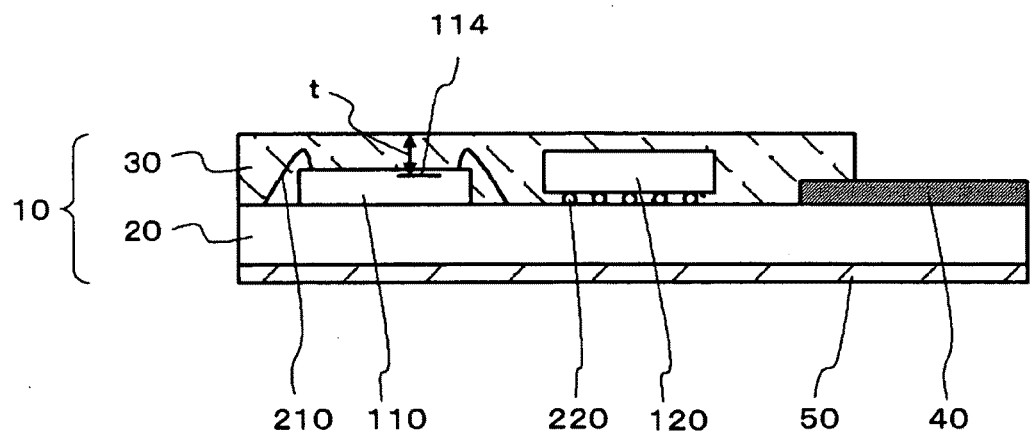
FIG. 1 is a sectional view showing the configuration of an external storage device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In addition, the same components are denoted by the same reference numerals in all drawings, and the explanation thereof will not be repeated.

FIG. 1 is a sectional view showing the configuration of an external storage device 10 according to a first embodiment. The external storage device 10 includes an interconnect substrate 20, at least one semiconductor chip (in an example shown in FIG. 1, two semiconductor chips 110 and 120), a storage element 122 (shown in FIG. 4), an inductor 114, a driver circuit 112 (shown in FIG. 4), an external terminal 40, and a sealing resin layer 30. The semiconductor chips 110 and 120 are disposed on a first surface (for example, an upper surface) of the interconnect substrate 20. The storage element 122 is provided in either of the semiconductor chips 110 and 120. The inductor 114 is also provided in either of the semiconductor chips 110 and 120. The driver circuit 112 is a circuit which drives the inductor 114, and is provided in either of the semiconductor chips 110 and 120. In the present embodiment, the storage element 122 is provided in the semiconductor chip 120, the inductor 114 is provided in the semiconductor chip 110, and the driver circuit 112 is provided in the semiconductor chip 110. The external terminal 40 is a contact type terminal, and at least some external terminals 40 are a power supply terminal and a ground terminal. The sealing resin layer 30 is formed on the first surface of the interconnect substrate 20 and seals the semiconductor chips 110 and 120 but does not cover the external terminal 40. In addition, the inductor 114 is formed at a surface of the semiconductor chip 110 not facing the interconnect substrate 20.

The interconnect substrate 20 is a printed circuit board, for example, and has an interconnect at least on the first surface. In addition, the interconnect substrate 20 has a protective resin layer 50 (for example, a solder resist layer) on a second surface which is an opposite surface to the first surface.

Figure 24:
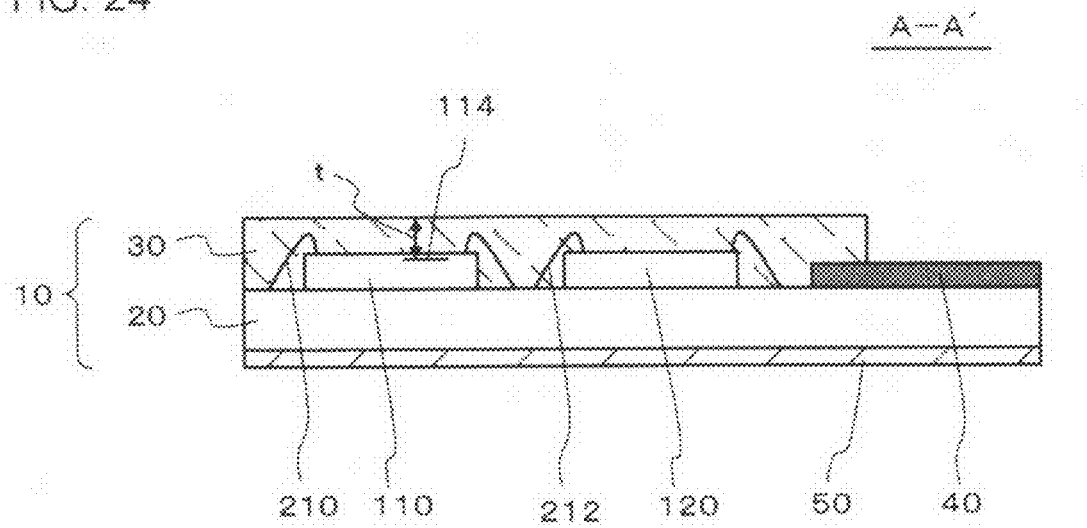
FIG. 24 is a sectional view showing a modification of the external storage device according to the first embodiment.

In the example shown in FIG. 1, the semiconductor chip 110 is fixed to the interconnect substrate 20 with its active surface upward. A multi-layered interconnect layer is provided on the active surface of the semiconductor chip 110. The inductor 114 is formed in one interconnect layer of the multi-layered interconnect layer, for example, in an uppermost interconnect layer. The diameter of the inductor 114 is equal to or less than 1 mm, for example. In addition, an electrode pad formed at the active surface of the semiconductor chip 110 is connected to the interconnect, which is formed at the first surface of the interconnect substrate 20, through a bonding wire 210. In addition, the semiconductor chip 120 is flip-chip-mounted on the interconnect substrate 20 with its active surface downward and is connected to the interconnect, which is formed at the first surface of the interconnect substrate 20, through a bump 220. However, the semiconductor chip 120 may be connected to the interconnect of the interconnect substrate 20 by a bonding wire 212 as shown in FIG. 24. In addition, the semiconductor chips 110 and 120 are connected to each other through the interconnect of the interconnect substrate 20.

Moreover, although the semiconductor chip 110 is a semiconductor chip designed for exclusive use, a general-purpose memory chip, for example, a general-purpose non-volatile memory chip may also be used as the semiconductor chip 120.

The external terminal 40 is provided in a plural number on the first surface of the interconnect substrate 20. As described above, at least some external terminals 40 are a power supply terminal and a ground terminal. Electric power supplied to the interconnect substrate 20 through the external terminal 40 is supplied to at least the driver circuit 112 of the inductor 114. In addition, when electric power is required for reading and writing of the storage element 122, the electric power is also supplied through the external terminal 40.

The semiconductor chips 110 and 120 are simultaneously sealed by the sealing resin layer 30. Accordingly, the thickness t of a portion above the inductor 114 of the semiconductor chip 110 in the external storage device 10 can be made small, for example, equal to or less than 0.5 mm. In addition, a side surface of the sealing resin layer 30 forms the same plane as a side surface of the interconnect substrate 20 except for a side surface facing the external terminal 40.

Figure 25:
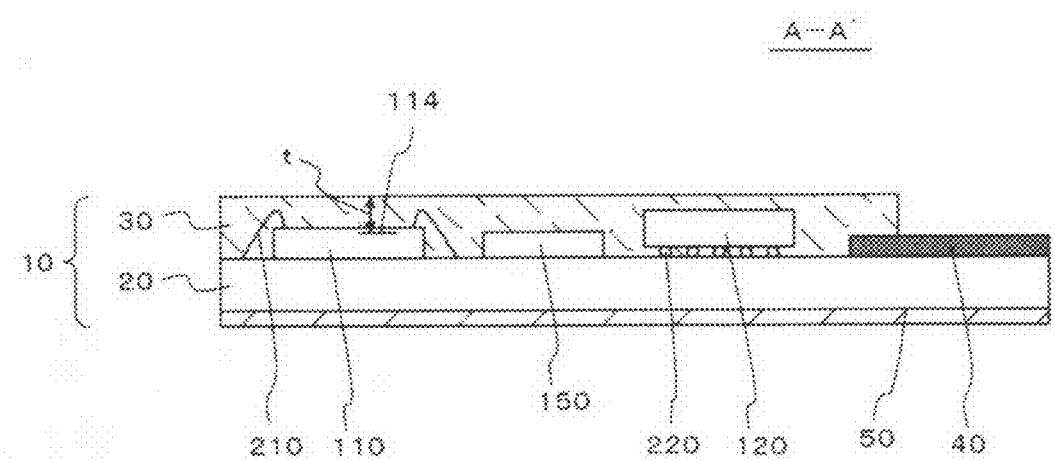
FIG. 25 is a sectional view showing a modification of the external storage device according to the first embodiment.

Moreover, as shown in FIG. 25, passive components 150, such as a chip conductor and a chip resistor, may be provided at the first surface of the interconnect substrate 20 of the external storage device 10. The passive components 150 are also sealed simultaneously with the semiconductor chips 110 and 120 by the sealing resin layer 30. In addition, package components (not shown in the drawings) may be provided at the first surface of the interconnect substrate 20.

Figure 2:
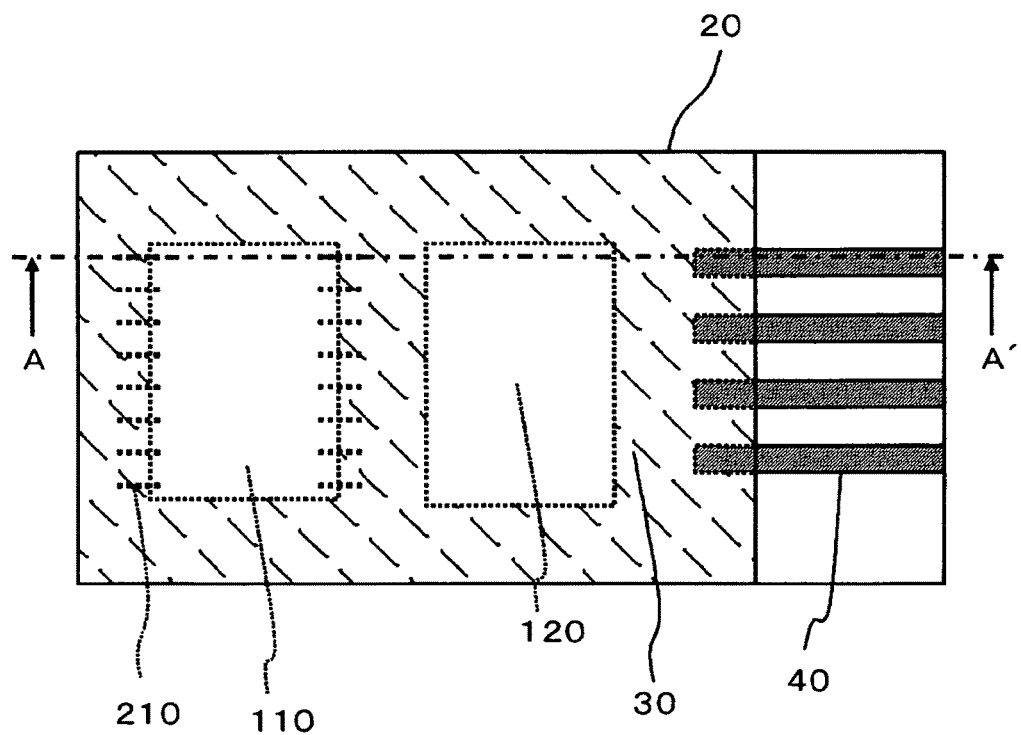
FIG. 2 is a plan view of the external storage device.

FIG. 2 is a plan view of the external storage device 10. FIG. 1 is equivalent to a sectional view taken along the line A-A' of FIG. 2. The external storage device 10 shown in FIGS. 1 and 2 is a card type storage device and is sold in a state where the content is stored in the storage element 122. The content stored in the storage element 122 is software, sound content, or image content. Specifically, the content stored in the storage element 122 is game software data, software for computer terminals, music data, or video data, for example.

The external storage device 10 and the interconnect substrate 20 have rectangular or square planar shapes. A plurality of external terminals 40 is provided along one side of the interconnect substrate 20 and extends in a direction perpendicular to the one side. The interconnect substrate 20 is sealed by the sealing resin layer 30 except for the vicinity of its one side, at which the external terminal 40 is provided, when seen in a plan view. In addition, the semiconductor chip 110 is located at the opposite side to the external terminal 40 with a line, which passes through the center of the external storage device 10 and is parallel to one side at which the external terminal 40 is provided, interposed therebetween.

Figure 3:
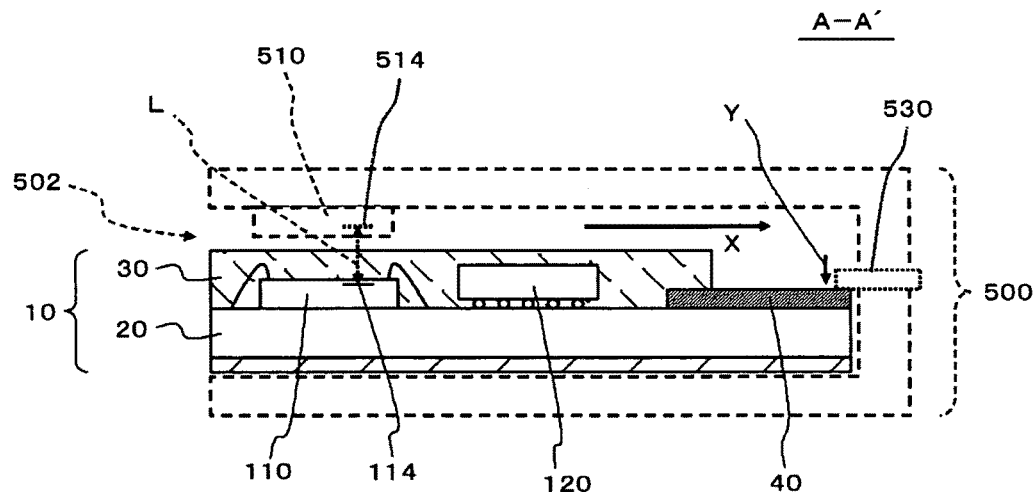
FIG. 3 is a sectional view showing a use state of the external storage device.

FIG. 3 is a sectional view showing a use state of the external storage device 10. The external storage device 10 is inserted in an insertion hole 502 of a dedicated reader 500 in a direction of arrow X from the side at which the external terminal 40 is provided. A plurality of contact type connecting terminals 530 is provided inside the insertion hole 502. In a state where the external storage device 10 is inserted in the insertion hole 502, the plurality of external terminals 40 comes in contact with the different connecting terminals 530 so as to be electrically connected therewith. Then, electric power is supplied from the connecting terminals 530 to the external storage device 10. In addition, there is a gap between the external storage device 10 and the inner surface of the insertion hole 502.

In addition, a read section 510 is provided at the inner surface of the insertion hole 502. The read section 510 has a semiconductor chip. This semiconductor chip has a multi-layered interconnect layer, and an inductor 514 for reception is formed in the multi-layered interconnect layer. The inductor 514 is disposed at a position facing each inductor 114 of the external storage device 10 in a state where the external storage device 10 is inserted in the insertion hole 502. As described above, the thickness t of a portion above the inductor 114 of the semiconductor chip 110 in the external storage device 10 is small. For this reason, a distance from the inductor 114 to the inductor 514 may be made short, for example, equal to or less than 1 mm. Accordingly, even if the diameter of the inductor 114 is equal to or less than 1 mm, communication between the inductors 114 and 514 can be performed.

Moreover, if the read section 510 is formed by fixing a semiconductor chip, which has the inductor 514 and a receiver circuit, over an interconnect substrate and sealing the semiconductor chip with sealing resin, the thickness of a portion located above the inductor 514 (in FIG. 3, below the inductor 514) in the read section 510 can be made small. In this case, the distance from the inductor 114 to the inductor 514 can be particularly shortened.

Figure 4:
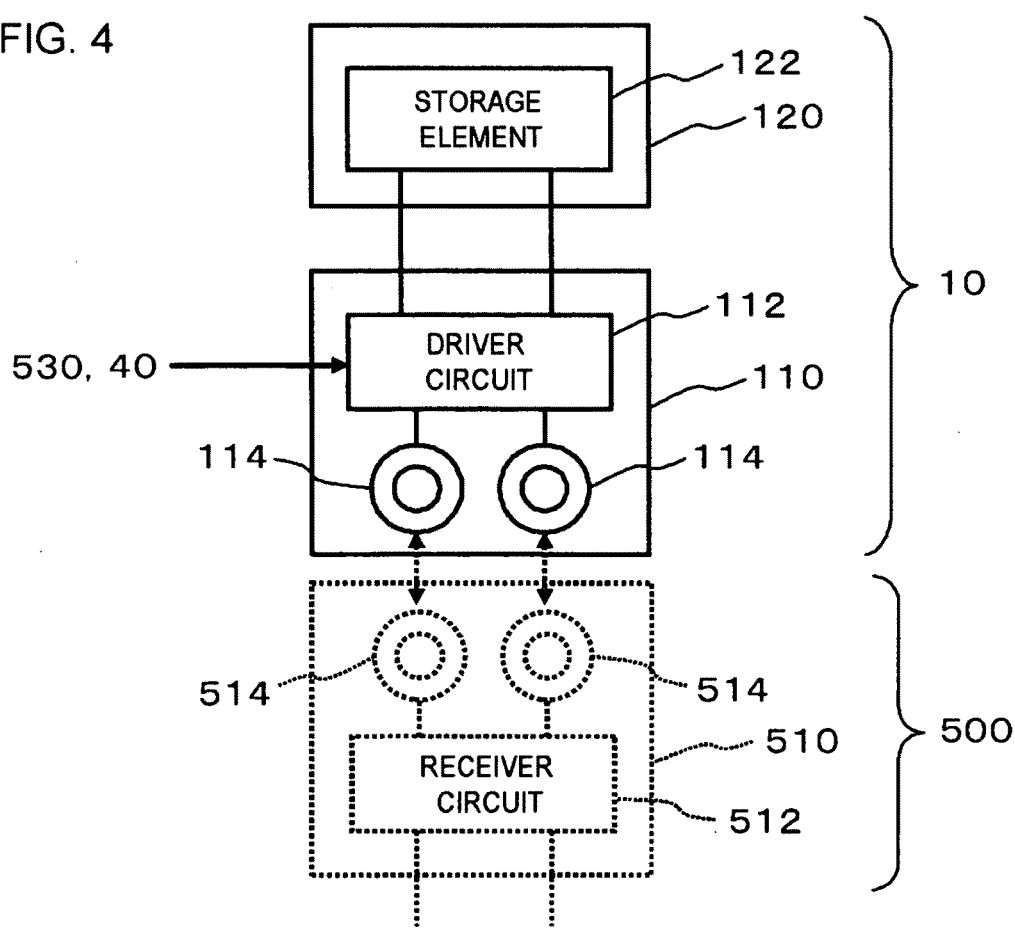
FIG. 4 is an equivalent circuit diagram in a use state of the external storage device.

FIG. 4 is an equivalent circuit diagram in a use state of the external storage device 10. The external storage device 10 and the read section 510 communicate with each other through the inductors 114 and 514. Specifically, the information stored in the storage element 122 is read by the driver circuit 112 and is output as an electromagnetic wave by the inductor 114. By the electromagnetic wave, an induced current is generated in the inductor 514. By interpreting the intensity of the induced current by the receiver circuit 512, the information stored in the storage element 122 is read into the read section 510. In addition, a control circuit which controls reading/writing from/into the storage element 122 is also provided in the semiconductor chip 110. This control circuit is located between the driver circuit 112 and the storage element 122 from the point of view of a circuit.

In the example shown in FIG. 4, the plural sets of inductors 114 and 514 are provided. In addition, transmission of the information described above is performed using a combination of some inductors 114 and 514. Which combination of the inductors 114 and 514 is to be used is appropriately changed according to pre-defined rules.

In addition, a driver circuit and an inductor for transmission may be added to the read section 510, and an inductor and a receiver circuit for reception may be added to the external storage device 10. In this case, the information can be transmitted from the read section 510 to the external storage device 10. The information is stored in the storage element 122.

Next, a method of manufacturing the external storage device 10 will be described using the sectional view of FIG. 1. First, the semiconductor chips 110 and 120 are disposed on the first surface of the interconnect substrate 20. In this case, the semiconductor chip 120 is flip-chip-mounted on the interconnect substrate 20. Then, the semiconductor chip 110 and the interconnect of the interconnect substrate 20 are connected to each other using the bonding wire 210. Then, the sealing resin layer 30 is provided on the first surface of the interconnect substrate 20 by performing mold sealing. In this case, the shape of a sealing die is made such that the sealing resin layer 30 does not cover the external terminal 40.

Next, operations and effects of the present embodiment will be described. According to the present embodiment, the information stored in the external storage device 10 is read by the read section 510 by performing communication between the inductors 114 and 514. Here, the inductor 114 is small because the inductor 114 is formed in the semiconductor chip 110. In other words, it is difficult to form an inductor, which has the same diameter as the inductor 114, without using a semiconductor process. In order to realize a semiconductor process, a large investment in facilities is required. Accordingly, it is difficult to manufacture imitation products of the semiconductor chip 110 in terms of costs. For this reason, according to the present embodiment, even if the content stored in the external storage device 10 can be read, it is not possible for those who copy the content to prepare an external storage device for storing the content. As a result, the tamper-proof property is improved.

In addition, the inductor 114 and the driver circuit 112 are provided in the separate semiconductor chip 110 from the semiconductor chip 120 having the storage element 122. Accordingly, a general-purpose memory chip can be used as the semiconductor chip 120 having the storage element 122.

In addition, since the semiconductor chips 110 and 120 are simultaneously sealed by one sealing resin layer 30, it is difficult to take out only one chip. For this reason, it is difficult to exchange only the semiconductor chip 110 in order to read the content stored in the semiconductor chip 120. In addition, it is also difficult to take out only one chip, which stores the operation information, of the semiconductor chips 110 and 120 in order to read the operation information. In addition, it is also difficult to invalidate the security by applying a condition, which induces an abnormal operation, to the chip in charge of the security of the semiconductor chips 110 and 120. Accordingly, the tamper-proof property is improved.

Moreover, since the surface of the sealing resin layer 30 can be evenly formed even if the heights of the semiconductor chips 110 and 120 are different, the mechanical strength of the external storage device 10 is increased. For this reason, the need to provide a housing for the external storage device 10 is decreased. In addition, also when a housing is provided, the housing can be made thin in a simple structure.

In addition, the surface of the sealing resin layer 30 is parallel to the external terminal 40. Accordingly, inserting the external storage device 10 into the reader 500 and taking out the external storage device 10 from the reader 500 can be easily and smoothly performed. For this reason, it is not necessary to provide a guide section for insertion and extraction of the reader 500 in the external storage device 10. Moreover, even if the guide section is provided, the structure can be made simple.

Generally, the external storage device 10 becomes thick if a guide section with a complicated structure is provided in the external storage device 10. Since a distance between the inductors 114 and 514 is increased if the external storage device 10 is thick, the diameter of the inductor 114 is increased. If the diameter of the inductor 114 is increased, an inductor which is compatible with the inductor 114 may be formed in a method other than the semiconductor process. As a result, the tamper-proof property is reduced.

Figure 26:
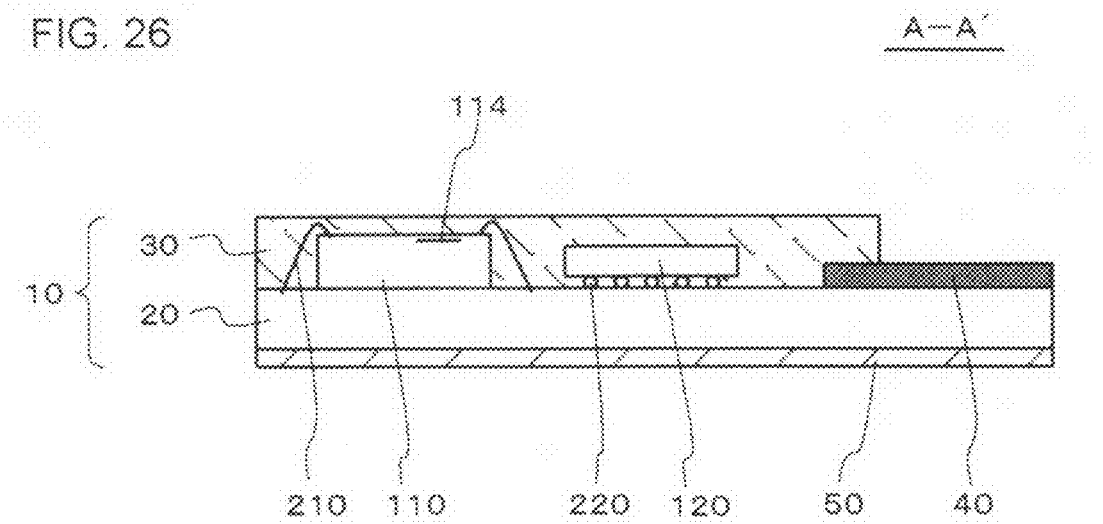
FIG. 26 is a sectional view showing a modification of the external storage device according to the first embodiment.

Moreover, as shown in FIG. 26, the upper surface of the semiconductor chip 110 may be located above the upper surface of the semiconductor chip 120. In this case, the distance between the inductors 114 and 514 can be made narrower. Moreover, although it is necessary to make thin a portion of the sealing resin layer 30 located above the semiconductor chip 110 in the present embodiment, exposure of the surface of the semiconductor chip 120 from the sealing resin layer 30 can be suppressed by locating the upper surface of the semiconductor chip 110 above the upper surface of the semiconductor chip 120.

Moreover, in the present embodiment, the external terminal 40 is formed at the first surface of the interconnect substrate 20 on which the semiconductor chips 110 and 120 are mounted. On the other hand, when the external storage device 10 is inserted into the reader 500, the reader 500 presses the connecting terminal 530 against the external terminal 40 in order to ensure the connection between the external terminal 40 and the connecting terminal 530. This pressing force acts in a direction of making the external terminal 40 move away from the read section 510 in the thickness direction of the external storage device 10, as indicated by arrow Y in FIG. 3.

Figure 27:
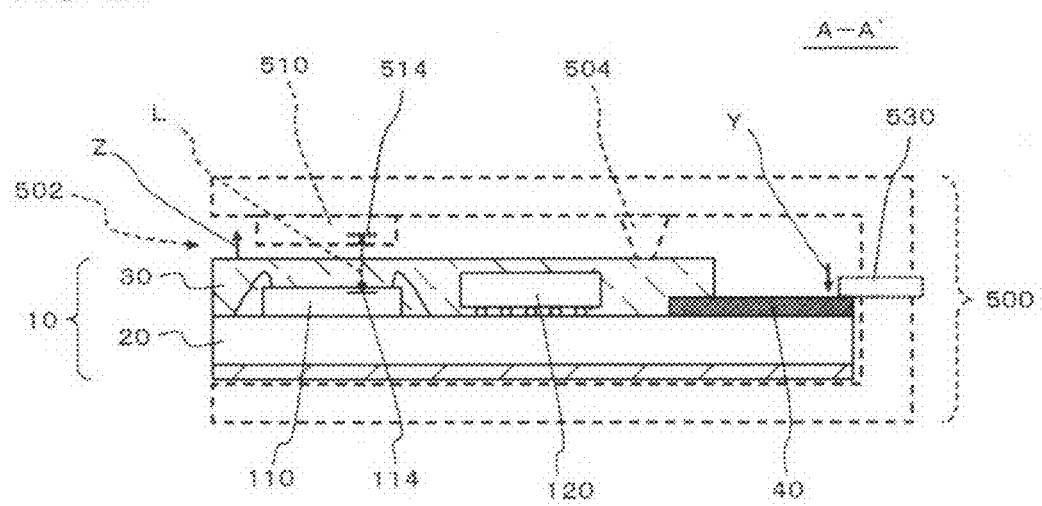
FIG. 27 is a sectional view showing a modification of FIG. 3.

Here, as described above, the semiconductor chip 110 is located at the opposite side to the external terminal 40 with a line, which passes through the center of the external storage device 10 and is parallel to one side at which the external terminal 40 is provided, interposed therebetween. In addition, there is a gap between the external storage device 10 and the inner surface of the insertion hole 502. Therefore, as shown in FIG. 27, a protruding section 504 located between the semiconductor chip 110 and the external terminal 40 when seen in a plan view may be provided on the inner surface of the insertion hole 502 and the tip of the protruding section 504 may be in contact with the external storage device 10. In this case, by the force indicated by the arrow Y, the external storage device 10 rotates in a direction, in which the inductor 114 of the semiconductor chip 110 becomes closer to the inductor 514 of the read section 510, with the protruding section 504 as a point of support.

Figure 5:
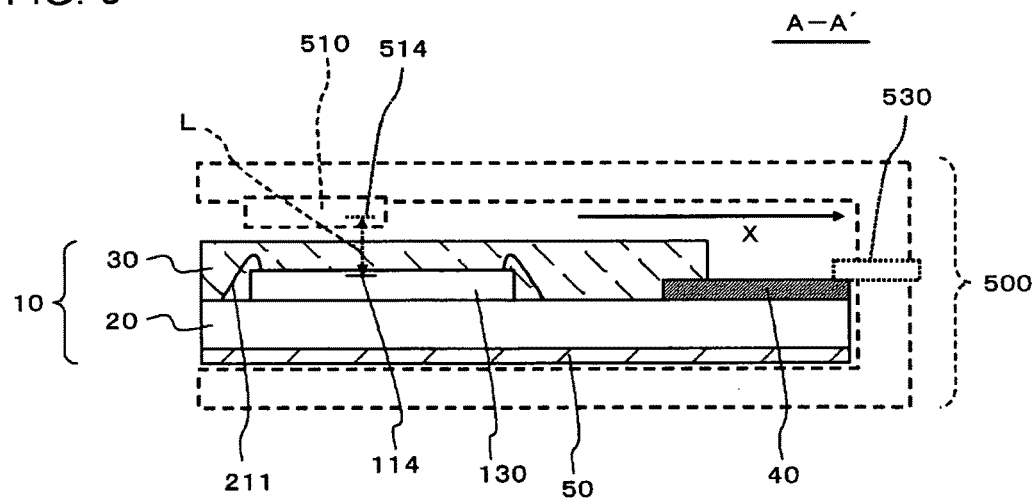
FIG. 5 is a sectional view showing the configuration and a use state of an external storage device according to a second embodiment.
Figure 6:
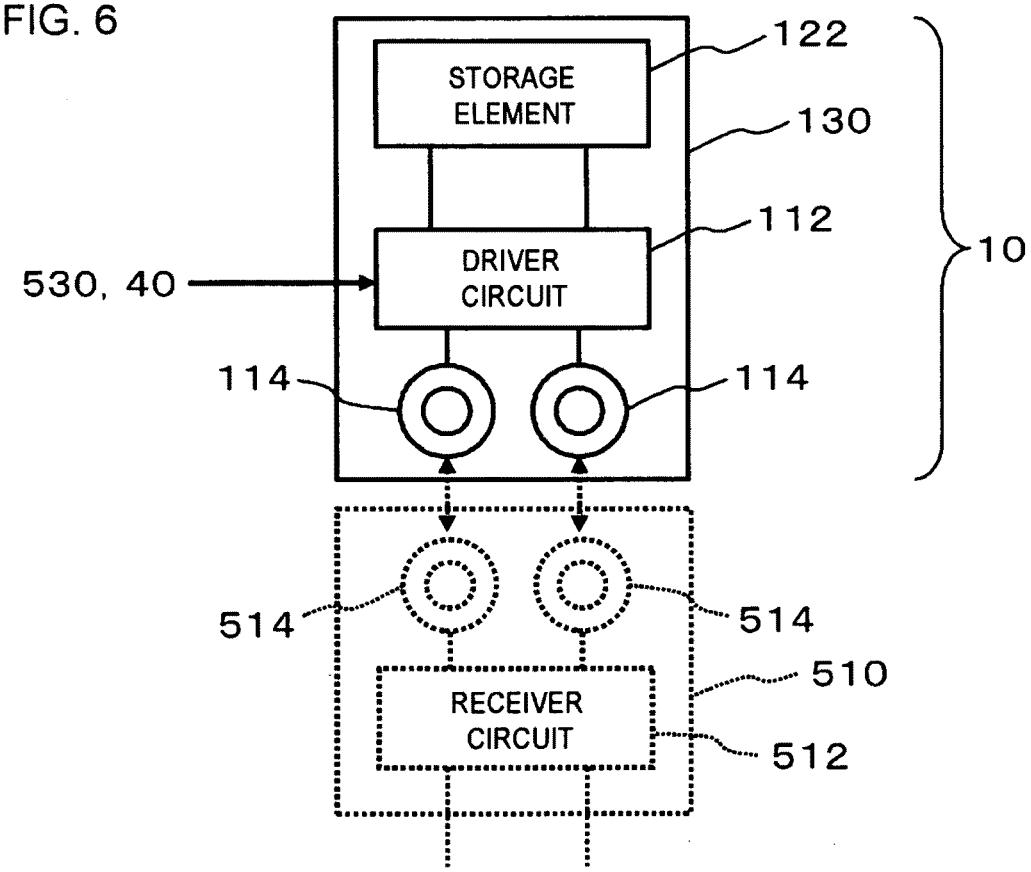
FIG. 6 is an equivalent circuit diagram of the external storage device in the state shown in FIG. 5.

FIG. 5 is a sectional view showing the configuration and a use state of an external storage device 10 according to a second embodiment. FIG. 6 is an equivalent circuit diagram of the external storage device 10 in the state shown in FIG. 5. FIGS. 5 and 6 are views equivalent to FIGS. 3 and 4 in the first embodiment. The external storage device 10 shown in FIGS. 5 and 6 has the same configuration as the external storage device 10 shown in the first embodiment except that a semiconductor chip 130 is provided instead of the semiconductor chips 110 and 120.

The semiconductor chip 130 is a semiconductor chip designed for exclusive use and has the storage element 122, the driver circuit 112, and the inductor 114. Moreover, in the semiconductor chip 130, an opposite surface to an active surface, that is, an opposite surface to a surface having the storage element 122, the driver circuit 112, and the inductor 114 is fixed to the interconnect substrate 20. An electrode pad of the semiconductor chip 130 is connected to an interconnect, which is formed at the surface of the interconnect substrate 20, through a bonding wire 211.

Also in the present embodiment, the same effects as in the first embodiment can be achieved. In addition, since the storage element 122, the driver circuit 112, and the inductor 114 are provided in one semiconductor chip 130, the external storage device 10 can be made small.

Figure 7:
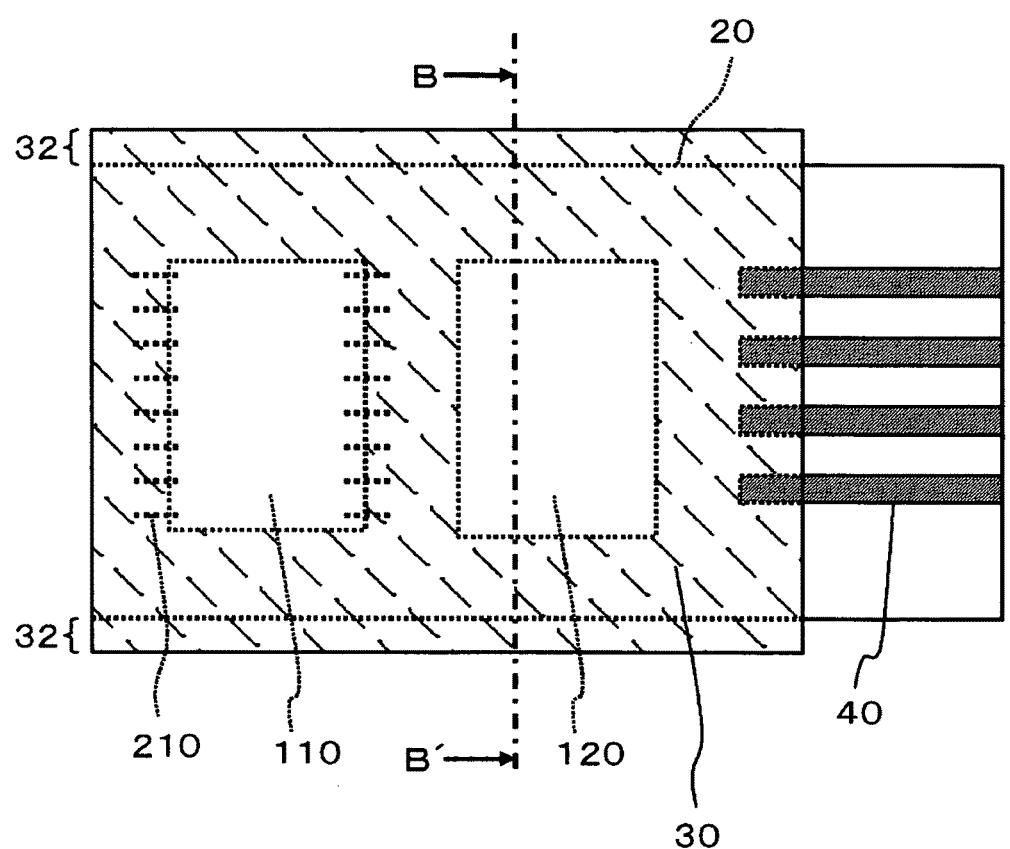
FIG. 7 is a plan view showing the configuration of an external storage device according to a third embodiment.
Figure 8:
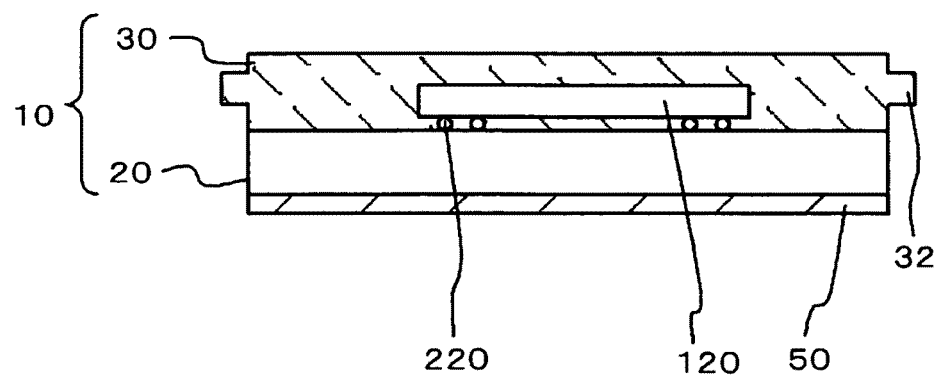
FIG. 8 is a sectional view taken along the line B-B' of FIG. 7.

FIG. 7 is a plan view showing the configuration of an external storage device 10 according to a third embodiment and is a view equivalent to FIG. 2 in the first embodiment. FIG. 8 is a sectional view taken along the line B-B' of FIG. 7. The external storage device 10 according to the present embodiment has the same configuration as the external storage device 10 according to the first embodiment except that a guide section 32 is provided.

The guide section 32 is formed by providing an uneven section in the sealing resin layer 30. In the present embodiment, the guide section 32 is protruding sections formed at two opposite side surfaces of the sealing resin layer 30. In the present embodiment, the guide section 32 is provided at two side surfaces perpendicular to a side, at which the external terminal 40 is provided, of the external storage device 10.

Figure 9A:
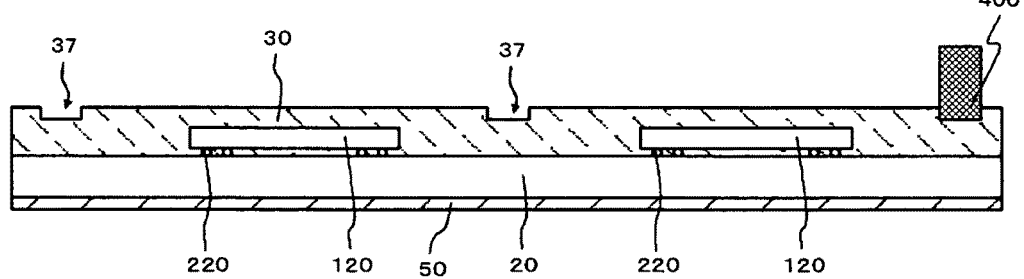
FIGS. 9A and 9B are sectional views showing a method of manufacturing the external storage device shown in FIGS. 7 and 8.
Figure 9B:
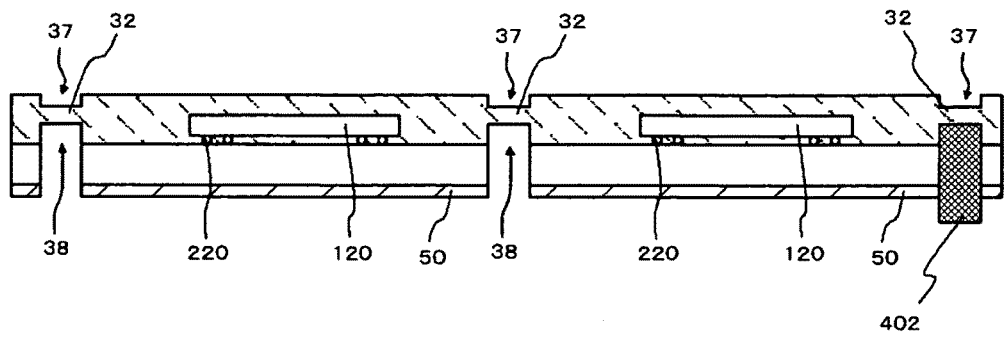
Figure 10:
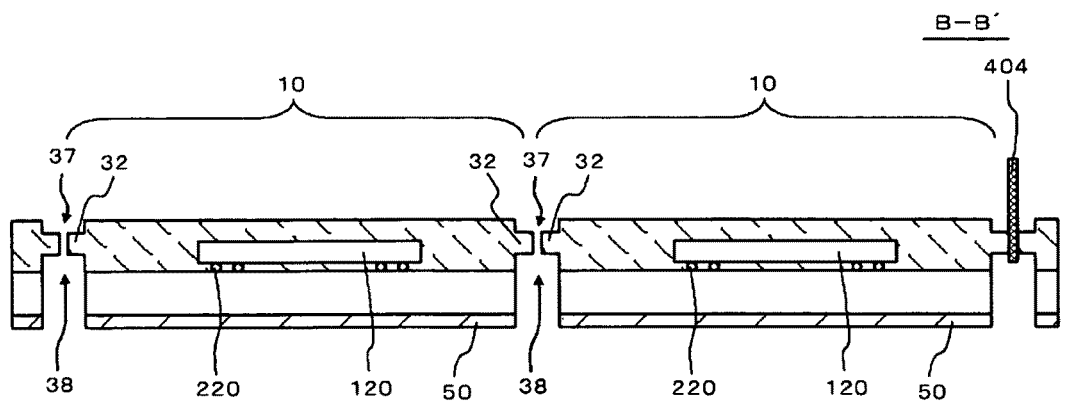
FIG. 10 is a sectional view showing a method of manufacturing the external storage device shown in FIGS. 7 and 8.

FIGS. 9A, 9B, and 10 are sectional views showing a method of manufacturing the external storage device shown in FIGS. 7 and 8. First, as shown in FIG. 9A, the interconnect substrate 20 is prepared. In this state, the interconnect substrate 20 has a shape in which portions, which become the plurality of external storage devices 10, are connected to each other. Then, the semiconductor chips 110 and 120 (in FIG. 9, only the semiconductor chip 120 is shown) are disposed on the interconnect substrate 20 for every portion which becomes the external storage device 10. Then, each of the plurality of semiconductor chips 110 is connected to an interconnect of the interconnect substrate 20 using the bonding wire 210 (not shown in FIG. 9).

Then, the plurality of semiconductor chips 110 and 120 is simultaneously sealed to form the sealing resin layer 30. In this state, the sealing resin layer 30 is not provided separately for each of the plurality of external storage devices 10. Accordingly, the sealing resin layer 30 is formed in a state where the portions which become the plurality of external storage devices 10 are connected to each other.

Subsequently, a dicing blade 400 is moved along a dicing line, which is located along the side at which the guide section 32 is provided, of dicing lines showing the cutting lines of the interconnect substrate 20 and the sealing resin layer 30. As a result, a groove 37 is formed in a top layer of the sealing resin layer 30.

Then, as shown in FIG. 9B, a dicing blade 402 is moved along a dicing line, which is located along the side at which the guide section 32 is provided, of the dicing lines. In this way, portions of the interconnect substrate 20 and the sealing resin layer 30 located at a side of the interconnect substrate 20 are cut. The width of the dicing blade 402 may be equal to the width of the dicing blade 400 or may be different from the width of the dicing blade 400. As a result, a groove 38 is formed. The groove 38 overlaps the groove 37 when seen in a plan view, but a bottom portion of the groove 38 is not connected with the groove 37. A distance from a bottom portion of the groove 37 to the bottom part of the groove 38 is equal to the thickness of the guide section 32. That is, in a state shown in the drawing, the plurality of external storage devices 10 is connected to each other by the portion which becomes the guide section 32.

Then, as shown in FIG. 10, the interconnect substrate 20 and the sealing resin layer 30 are cut by moving a dicing blade 404 along a dicing line. The width of the dicing blade 404 is smaller than the widths of the dicing blades 400 and 402. Thus, the plurality of external storage device 10 is separated from each other, and the guide section 32 is formed.

Also in the present embodiment, the same effects as in the first embodiment can be achieved. In addition, since the guide section 32 is provided, breakage of the external storage device 10 when inserting the external storage device 10 into the insertion hole 502 can be suppressed by forming an uneven section corresponding to the guide section 32 in the insertion hole 502 of the reader 500. Moreover, since the guide section 32 is formed at the side surface of the sealing resin layer 30, an increase in the distance from the inductor 114 to the inductor 514 due to the guide section 32 does not occur.

Figure 11:
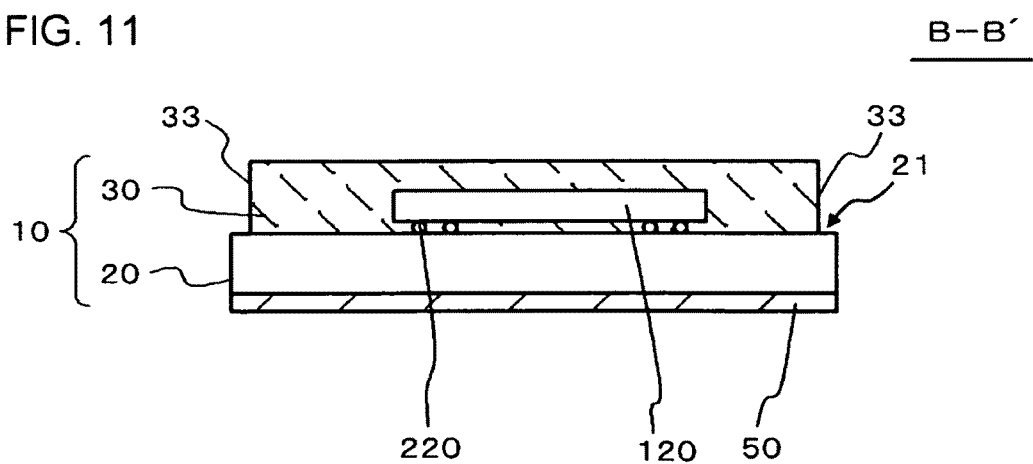
FIG. 11 is a sectional view showing the configuration of an external storage device according to a fourth embodiment.

FIG. 11 is a sectional view showing the configuration of an external storage device 10 according to a fourth embodiment. FIG. 11 is equivalent to a sectional view taken along the line B-B' of FIG. 7. The external storage device 10 shown in FIG. 11 has the same configuration as the external storage device 10 according to the third embodiment except for the following points.

First, the guide section 32 is not provided. Moreover, among side surfaces of the sealing resin layer 30, two side surfaces 33 parallel to the direction in which the external storage device 10 is inserted into the insertion hole 502 of the reader 500 are located over one surface of the interconnect substrate 20. Accordingly, a step difference 21 is generated between the sealing resin layer 30 and the interconnect substrate 20. The step difference 21 functions as a guide for insertion.

Figure 12A:
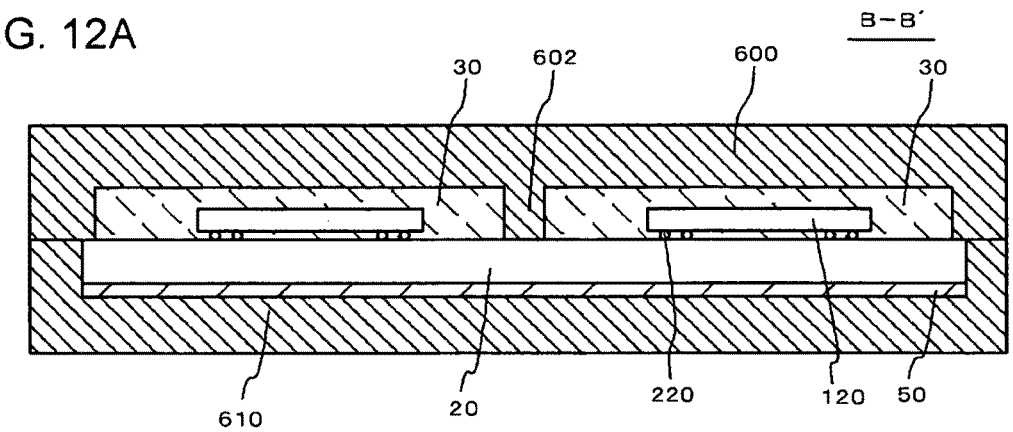
FIGS. 12A and 12B are sectional views showing a method of manufacturing the external storage device shown in FIG. 11.

FIG. 12 is a sectional view showing a method of manufacturing the external storage device 10 shown in FIG. 11. First, as shown in FIG. 12A, the interconnect substrate 20 is prepared. In this state, the interconnect substrate 20 has a shape in which portions, which become the plurality of external storage devices 10, are connected to each other. Then, the semiconductor chips 110 and 120 (in FIG. 12A, only the semiconductor chip 120 is shown) are disposed on the interconnect substrate 20 for every portion which becomes the external storage device 10. Then, each of the plurality of semiconductor chips 110 is connected to an interconnect of the interconnect substrate 20 using the bonding wire 210 (not shown in FIG. 12A).

Then, the interconnect substrate 20 in a state where the semiconductor chips 110 and 120 are mounted is disposed in a lower mold 610 which is a sealing die. Then, an upper mold 600 corresponding to the lower mold 610 is disposed on the lower mold 610 and the interconnect substrate 20. A protruding section 602 is provided in a ceiling portion of the inner surface of the upper mold 600. The protruding section 602 has a tip which is flat. This flat portion is in contact with a region where the step difference 21 is to be formed in the dicing line of the interconnect substrate 20. The width of the protruding section 602 is larger than that of a dicing blade 410 to be described later.

Subsequently, sealing resin is injected into the space between the lower mold 610 and the upper mold 600. As a result, the sealing resin layer 30 is formed. In this state, the sealing resin layer 30 is not formed in a portion where the protruding section 602 is located. As a result, the sealing resin layer 30 has an independent shape for every external storage device 10.

Figure 12B:
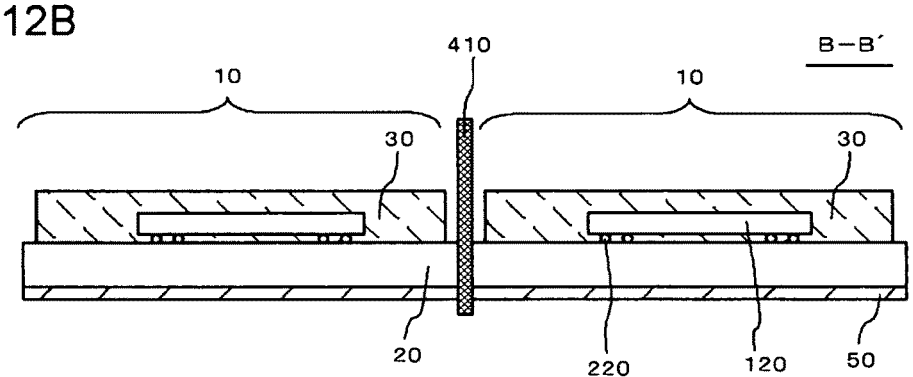

Then, as shown in FIG. 12B, the lower mold 610 and the upper mold 600 are removed. Then, the interconnect substrate 20 is cut by moving the dicing blade 410 along the dicing line. As a result, the plurality of external storage devices 10 is separated from each other. As described above, the width of the protruding section 602 of the upper mold 600 is larger than that of the dicing blade 410. Accordingly, a part of the interconnect substrate 20 covered by the protruding section 602 remains. This forms the step difference 21.

Also in the present embodiment, the same effects as in the third embodiment can be achieved. Compared with the third embodiment, the number of steps when cutting the interconnect substrate 20 in order to separate the external storage devices 10 into pieces is reduced.

Figure 13:
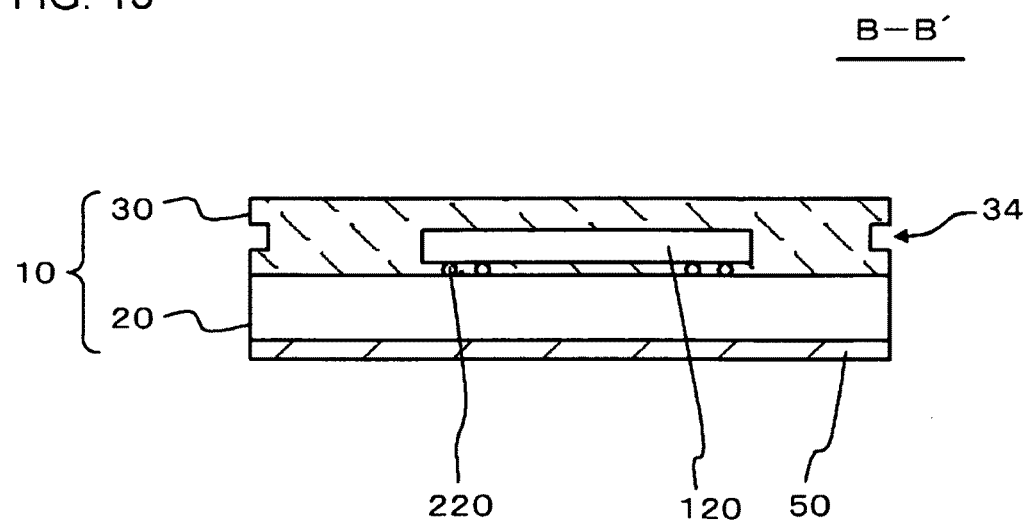
FIG. 13 is a sectional view showing the configuration of an external storage device according to a fifth embodiment.

FIG. 13 is a sectional view showing the configuration of an external storage device 10 according to a fifth embodiment. FIG. 13 is equivalent to a sectional view taken along the line B-B' of FIG. 7. The external storage device 10 shown in FIG. 13 has the same configuration as the external storage device 10 according to the third embodiment except that a groove shaped guide section 34 is provided instead of the guide section 32 which is a protruding section.

Figure 14:
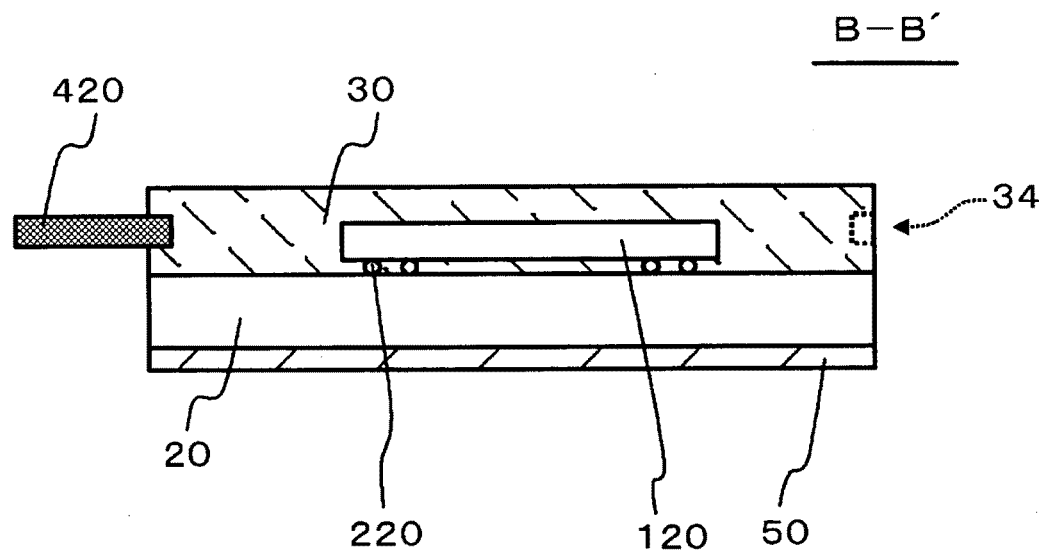
FIG. 14 is a sectional view showing a method of manufacturing the external storage device shown in FIG. 13.

FIG. 14 is a sectional view showing a method of manufacturing the external storage device shown in FIG. 13. First, the interconnect substrate 20 is prepared. In this state, the interconnect substrate 20 has a shape in which portions, which become the plurality of external storage devices 10, are connected to each other. Then, the semiconductor chips 110 and 120 (in FIG. 14, only the semiconductor chip 120 is shown) are disposed on the interconnect substrate 20 for every portion which becomes the external storage device 10. Then, each of the plurality of semiconductor chips 110 is connected to an interconnect of the interconnect substrate 20 using the bonding wire 210 (not shown in FIG. 14).

Then, the plurality of semiconductor chips 110 and 120 is simultaneously sealed to form the sealing resin layer 30. In this state, the sealing resin layer 30 is not provided separately for each of the plurality of external storage devices 10. Accordingly, the sealing resin layer 30 is formed in a state where the portions which become the plurality of external storage devices 10 are connected to each other. Then, the sealing resin layer 30 and the interconnect substrate 20 are cut using a dicing blade (not shown in the drawings), so that the plurality of external storage devices 10 is separated into pieces.

Then, the groove shaped guide section 34 is formed using a dicing blade 420.

Also in the present embodiment, the same effects as in the third embodiment can be achieved.

Figure 15:
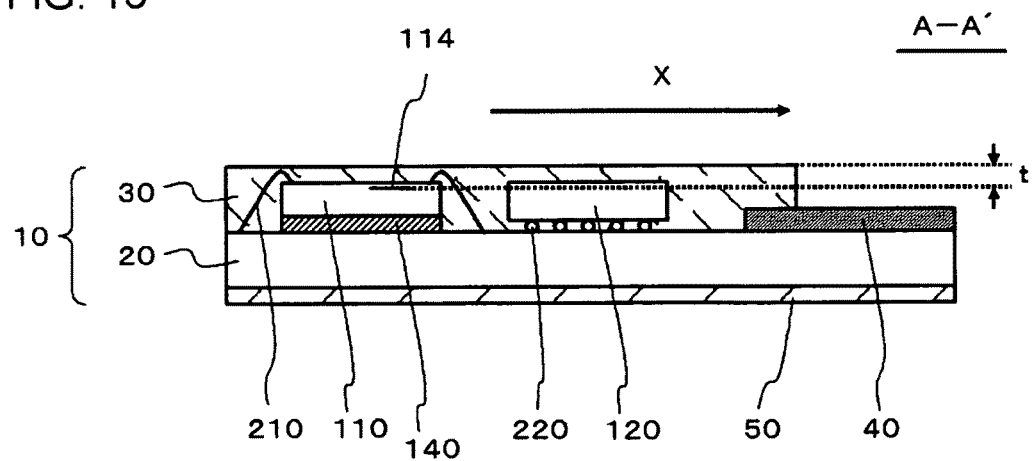
FIG. 15 is a sectional view showing the configuration of an external storage device according to a sixth embodiment.

FIG. 15 is a sectional view showing the configuration of an external storage device 10 according to a sixth embodiment and is equivalent to a sectional view taken along the line A-A' of FIG. 2 in the first embodiment. The external storage device 10 shown in FIG. 15 has the same configuration as the external storage device 10 according to the first embodiment except that a supporting member 140 is provided.

The supporting member 140 is located between the first surface of the interconnect substrate 20 and the semiconductor chip 110. That is, the supporting member 140 is provided on the first surface of the interconnect substrate 20, and the semiconductor chip 110 is provided on the supporting member 140.

Also in the present embodiment, the same effects as in the first embodiment can be achieved. In addition, the upper surface of the semiconductor chip 110 may be located below the upper surface of the semiconductor chip 120, for example, like the case where the semiconductor chip 120 is thicker than the semiconductor chip 110. In such a case, since the thickness of the sealing resin layer 30 is designed in accordance with the upper surface of the semiconductor chip 120, the thickness t from the inductor 114 to the upper surface of the sealing resin layer 30 may be increased. On the other hand, in the present embodiment, since the supporting member 140 is provided between the first surface of the interconnect substrate 20 and the semiconductor chip 110, the thickness t can be reduced.

Figure 28:
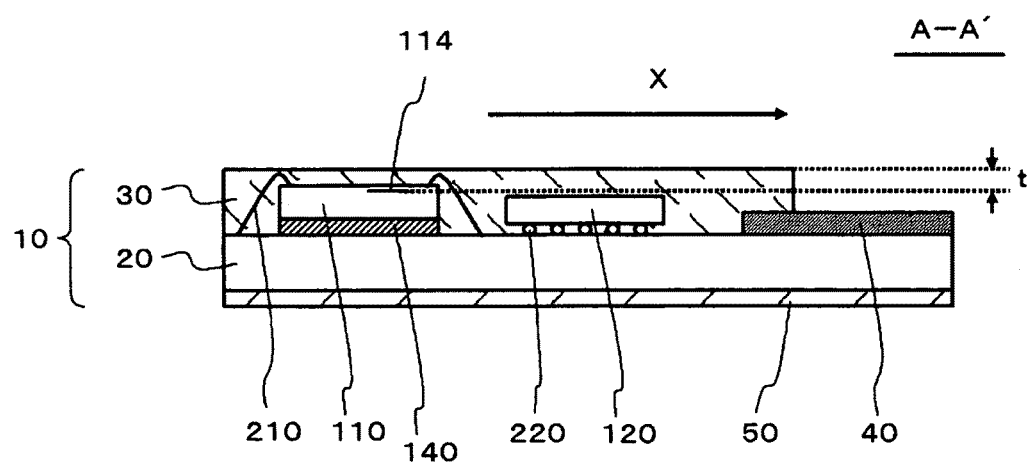
FIG. 28 is a sectional view showing a modification of the external storage device according to the sixth embodiment.

Moreover, in order to reduce the distance between the inductors 114 and 514, it is necessary to make thin a portion of the sealing resin layer 30 located above the semiconductor chip 110. On the other hand, as shown in FIG. 28, if the semiconductor chip 120 is made thin by back surface grinding, the upper surface of the semiconductor chip 110 can be located above the upper surface of the semiconductor chip 120. In this case, exposure of the surface of the semiconductor chip 120 from the sealing resin layer 30 can be suppressed.

Figure 16:
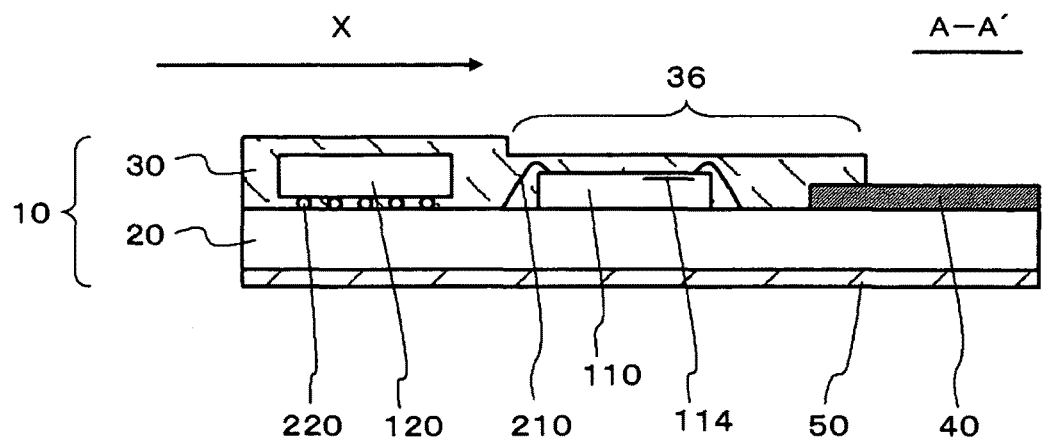
FIG. 16 is a sectional view showing the configuration of an external storage device according to a seventh embodiment.

FIG. 16 is a sectional view showing the configuration of an external storage device 10 according to a seventh embodiment and is equivalent to a sectional view taken along the line A-A' of FIG. 2 in the first embodiment. The external storage device 10 shown in FIG. 16 has the same configuration as the external storage device 10 according to the first embodiment except for the following points.

First, a recess 36 is formed in the sealing resin layer 30. The recess 36 is formed at least in a region overlapping the inductor 114 when seen in a plan view. In the example shown in FIG. 16, the recess 36 overlaps the entire surface of the semiconductor chip 110. Moreover, when seen from the insertion direction X, the external terminal 40, the semiconductor chip 110, and the semiconductor chip 120 are aligned in this order. In addition, the recess 36 is connected to a side of the sealing resin layer 30 facing the external terminal 40. In other words, in the sealing resin layer 30, a region where the semiconductor chip 120 is provided is thicker than the other regions.

Figure 17:
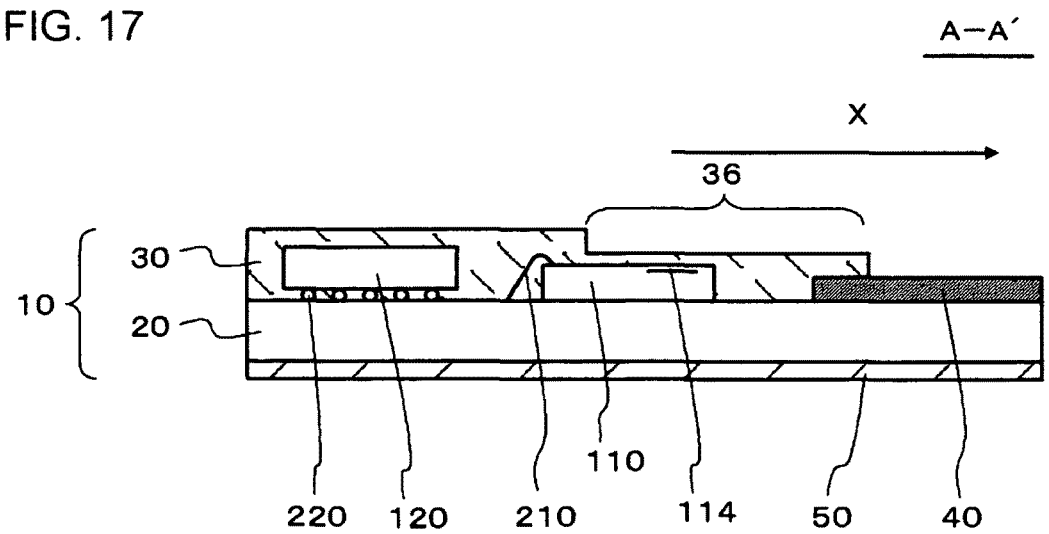
FIG. 17 is a view showing a modification of the external storage device shown in FIG. 16.

FIG. 17 is a view showing a modification of the external storage device 10 shown in FIG. 16. In the example shown in FIG. 17, the recess 36 overlaps only a part of the semiconductor chip 110 when seen in a plan view but overlaps at least the inductor 114.

Also in the present embodiment, the same effects as in the first embodiment can be achieved. Moreover, even if the upper surface of the semiconductor chip 110 is located below the upper surface of the semiconductor chip 120, the thickness t from the inductor 114 to the upper surface of the sealing resin layer 30 can be reduced.

Figure 18:
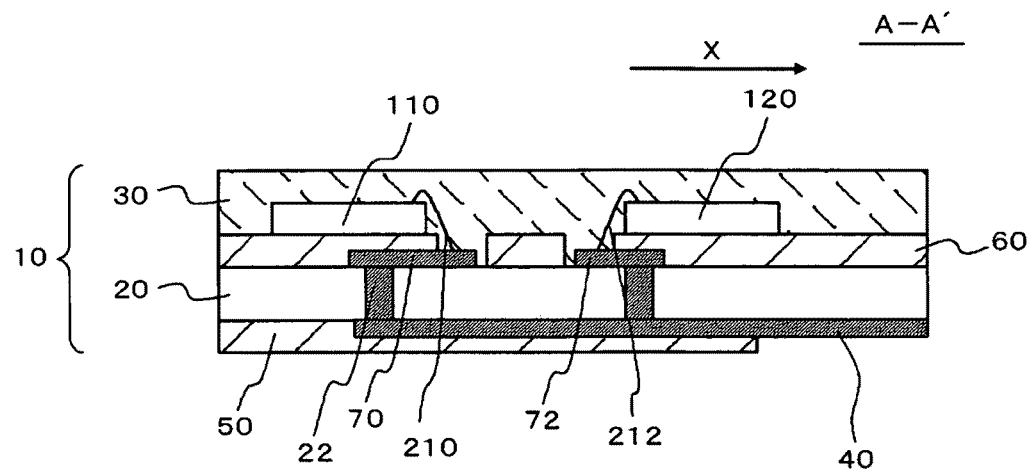
FIG. 18 is a sectional view showing the configuration of an external storage device according to an eighth embodiment.

FIG. 18 is a sectional view showing the configuration of an external storage device 10 according to an eighth embodiment and is equivalent to a sectional view taken along the line A-A' of FIG. 2 in the first embodiment. The external storage device 10 shown in FIG. 18 has the same configuration as the external storage device 10 according to the first embodiment except for the following points.

The semiconductor chips 110 and 120 are located on a protective resin layer 60 (for example, a solder resist layer) formed on the first surface of the interconnect substrate 20. In addition, the semiconductor chip 120 is not flip-chip-connected to the interconnect substrate 20, and is disposed with its active surface upward.

In addition, the external terminal 40 is formed at a second surface (for example, a back surface) of the interconnect substrate 20 opposite the first surface. The external terminal 40 is connected to interconnects 70 and 72, which are located at the first surface of the interconnect substrate 20, through via holes 22 passing through the interconnect substrate 20. The interconnect 70 is connected to an electrode pad of the semiconductor chip 110 through the bonding wire 210, and the interconnect 72 is connected to an electrode pad of the semiconductor chip 120 through the bonding wire 212.

Moreover, in the example shown in FIG. 18, the sealing resin layer 30 is formed only at the first surface side of the interconnect substrate 20. Accordingly, the external terminal 40 is not covered by the sealing resin layer 30.

Also in the present embodiment, the same effects as in the first embodiment can be achieved. Moreover, the external terminal 40 is formed at the surface (second surface) of the interconnect substrate 20 opposite the surface (first surface) on which the semiconductor chips 110 and 120 are mounted. When the external storage device 10 is inserted into the reader 500 shown in FIG. 3, the reader 500 presses the connecting terminal 530 against the external terminal 40 in order to ensure the connection between the external terminal 40 and the connecting terminal 530. This pressing force acts in a direction of making the Inductor 114 of the semiconductor chip 110 closer to the inductor 514 of the read section 510. Accordingly, the inductor 114 can be brought close to the inductor 514.

Figure 19A:
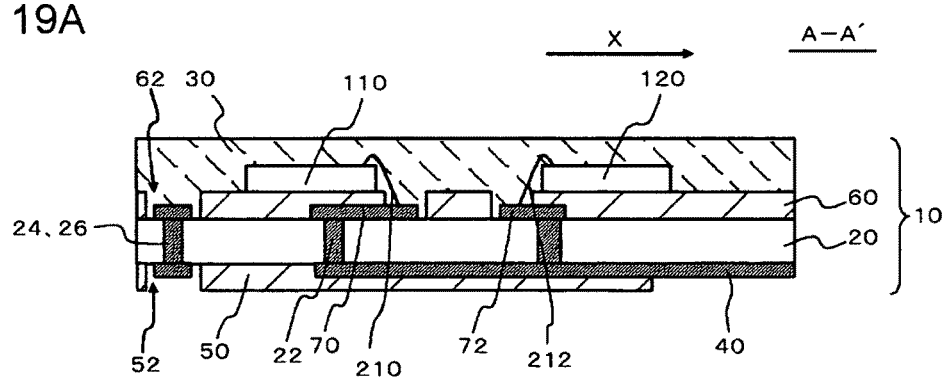
FIG. 19A is a sectional view showing the configuration of an external storage device according to a ninth embodiment.

FIG. 19A is a sectional view showing the configuration of an external storage device 10 according to a ninth embodiment and is equivalent to FIG. 18 in the eighth embodiment. The external storage device 10 shown in FIG. 19A has the same configuration as the external storage device 10 according to the eighth embodiment except that a penetrating hole 24 for alignment is provided in the interconnect substrate 20.

Figure 19B:
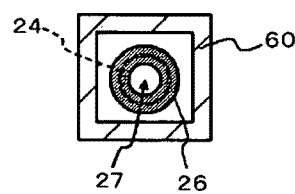
FIG. 19B is an enlarged plan view showing the configuration of a penetrating hole.

FIG. 19B is an enlarged plan view showing the configuration of the penetrating hole 24. In FIG. 19B, the sealing resin layer 30 is not shown. The penetrating hole 24 is formed through the same process as the process of forming the via hole 22. Accordingly, a conductive film 26, for example, a laminated film of a Cu film and an Au film is formed in the periphery and inside wall of the penetrating hole 24. However, since the entire penetrating hole 24 is not embedded by the conductive film 26, a through hole 27 remains in the penetrating hole 24 even after the conductive film 26 is formed. In addition, the conductive film 26 is connected to neither a power supply interconnect of the interconnect substrate 20 nor a signal interconnect nor a ground interconnect. In addition, the conductive film 26 may be connected to the ground interconnect.

Moreover, as shown in FIG. 19A, openings 52 and 62 through which the penetrating hole 24 is exposed are formed in the protective resin layers 50 and 60. When placing the semiconductor chips 110 and 120 on the interconnect substrate 20, the positions of the semiconductor chips 110 and 120 are decided with the through hole 27 of the penetrating hole 24 as a reference.

Next, a method of manufacturing the external storage device 10 shown in FIG. 19A will be described. First, the interconnect substrate 20 is prepared. In this state, the interconnect substrate 20 has a shape in which portions, which become the plurality of external storage devices 10, are connected to each other. Then, the semiconductor chips 110 and 120 are disposed on the interconnect substrate 20 for every portion which becomes the external storage device 10. In this case, the positions of the semiconductor chips 110 and 120 are decided with the through hole 27 of the penetrating hole 24 as a reference.

Then, the plurality of semiconductor chips 110 and 120 is connected to the interconnects 70 and 72 of the interconnect substrate 20 using the bonding wires 210 and 212.

Then, the plurality of semiconductor chips 110 and 120 is simultaneously sealed to form the sealing resin layer 30. In this state, the sealing resin layer 30 is not provided separately for each of the plurality of external storage devices 10. Accordingly, the sealing resin layer 30 is formed in a state where the portions which become the plurality of external storage devices 10 are connected to each other. In addition, since the first surface of the interconnect substrate 20 is sealed by the sealing resin layer 30, the through hole 27 of the penetrating hole 24 cannot be confirmed from the first surface side. However, from the second surface side of the interconnect substrate 20 opposite the first surface, the through hole 27 can be seen. In addition, when forming the sealing resin layer 30, the through hole 27 may be filled with a filling material in advance to form the sealing resin layer 30. In this case, leakage of resin, which becomes the sealing resin layer 30, to the second surface side of the interconnect substrate 20 through the through hole 27 can be suppressed. Moreover, the filling material may be removed from the second surface side of the interconnect substrate 20 after forming the sealing resin layer 30 or may be left as it is.

Subsequently, alignment is performed with the through hole 27 of the penetrating hole 24 as a reference from the second surface side of the interconnect substrate 20, and then the interconnect substrate 20 and the sealing resin layer 30 are cut from the second surface side. As a result, the interconnect substrate 20 and the sealing resin layer 30 are separated into pieces in units of a set of semiconductor chips 110 and 120 and the plurality of external storage devices 10 is formed.

Also in the present embodiment, the same effects as in the first embodiment can be achieved. Moreover, when the diameter of the inductor 114 of the semiconductor chip 110 is small like the present embodiment, the inductor 114 and the inductor 514 of the reader 500 do not overlap each other if slightest shift of the position of the semiconductor chip 110 occurs in the external storage device 10. As a result, the information cannot be read. On the other hand, in the present embodiment, alignment when mounting the semiconductor chips 110 and 120 and alignment when separating the plurality of external storage device 10 into pieces by dicing the interconnect substrate 20 and the sealing resin layer 30 are performed with the same through hole 27 as a reference. Accordingly, positional deviation of the semiconductor chip 110 in the external storage device 10 can be suppressed. In particular, if the through hole 27 and the semiconductor chip 110 are formed adjacent to each other and other interconnects or elements are not located between them, it is possible to shorten a time until a mounter, which mounts the semiconductor chip 110 on the interconnect substrate 20, moves to check the position of the through hole 27.

In addition, the penetrating hole 24, the conductive film 26, the through hole 27, and the openings 52 and 62 may also be formed in a portion of the interconnect substrate 20 which does not become either of the external storage devices 10. In this case, the penetrating hole 24, the conductive film 26, the through hole 27, and the openings 52 and 62 are not left in the external storage device 10.

Figure 20:
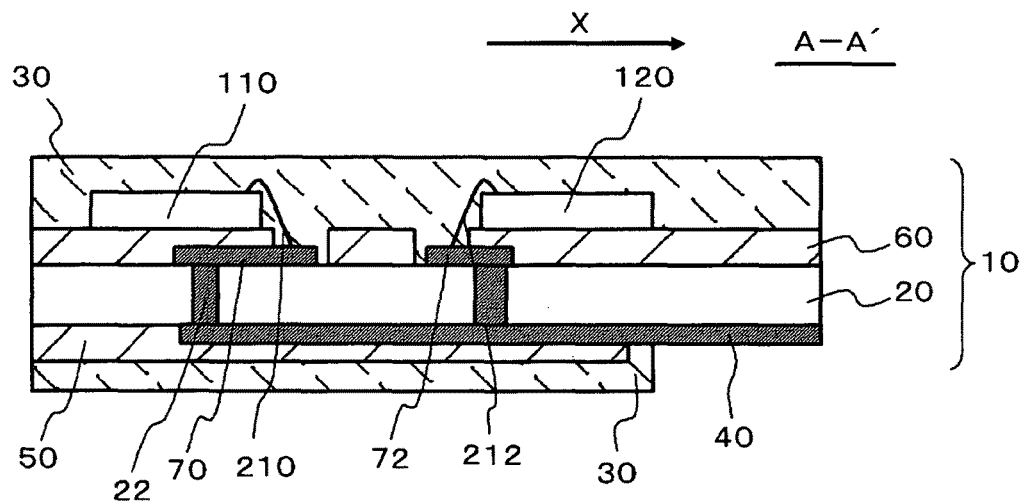
FIG. 20 is a sectional view showing the configuration of an external storage device according to a tenth embodiment.

FIG. 20 is a sectional view showing the configuration of an external storage device 10 according to a tenth embodiment. The external storage device 10 shown in FIG. 20 has the same configuration as the external storage device 10 according to the ninth embodiment except for the following points.

First, the sealing resin layer 30 is also formed at the second surface side of the interconnect substrate 20. Here, the sealing resin layer 30 does not cover the external terminal 40. In addition, the penetrating hole 24, the conductive film 26, the through hole 27, and the openings 52 and 62 shown in the ninth embodiment are formed in a portion of the interconnect substrate 20 which does not become either of the external storage devices 10. Accordingly, the external storage device 10 does not have the penetrating hole 24, the conductive film 26, the through hole 27, and the openings 52 and 62.

Figure 21:
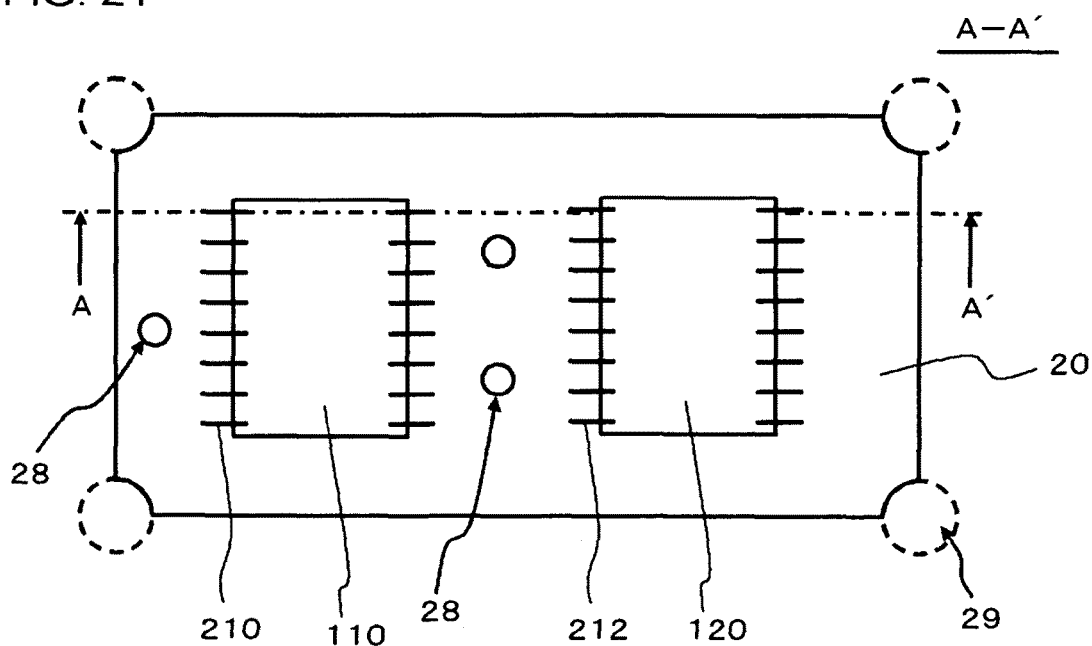
FIG. 21 is a plan view showing the shape of an interconnect substrate.

FIG. 21 is a plan view showing the shape of the interconnect substrate 20 in the present embodiment. The interconnect substrate 20 has a plurality of through holes 28 and 29 at positions which do not overlap the semiconductor chips 110 and 120 and an interconnect on the interconnect substrate 20. The through hole 28 is located in a region of the interconnect substrate 20 which becomes the external storage device 10, and the through hole 29 is located in each of the portions of the interconnect substrate 20 which become four angles of the external storage device 10. The through holes 28 and 29 serve to guide the sealing resin layer 30 from the first surface side of the interconnect substrate 20 to the second surface side. That is, the sealing resin layer 30 can also be formed at the second surface side of the interconnect substrate 20 by providing the through holes 28 and 29.

Also in the present embodiment, the same effects as in the first embodiment can be achieved. In addition, since the sealing resin layer 30 is also formed at the second surface side of the interconnect substrate 20, durability of the external storage device 10 can be improved.

Figure 22:
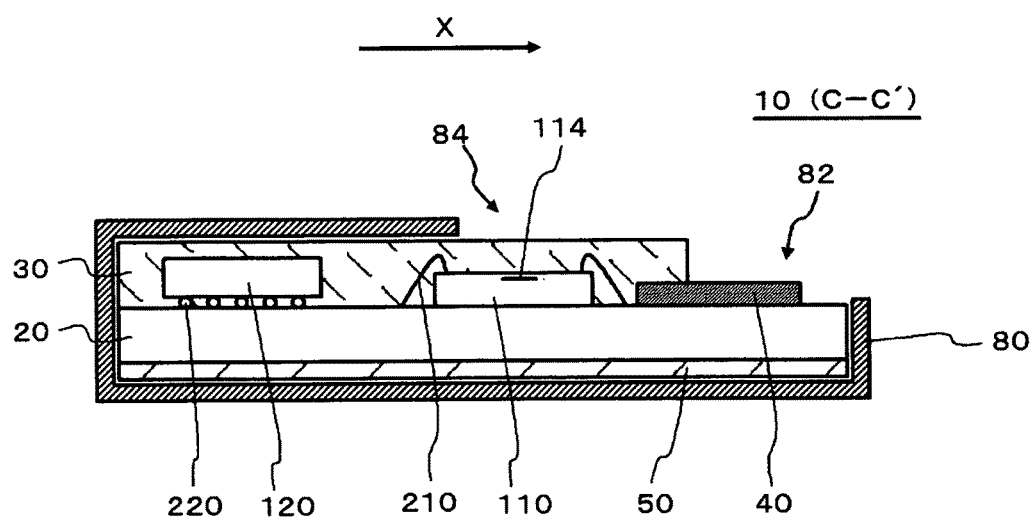
FIG. 22 is a sectional view showing the configuration of an external storage device according to an eleventh embodiment.
Figure 23:
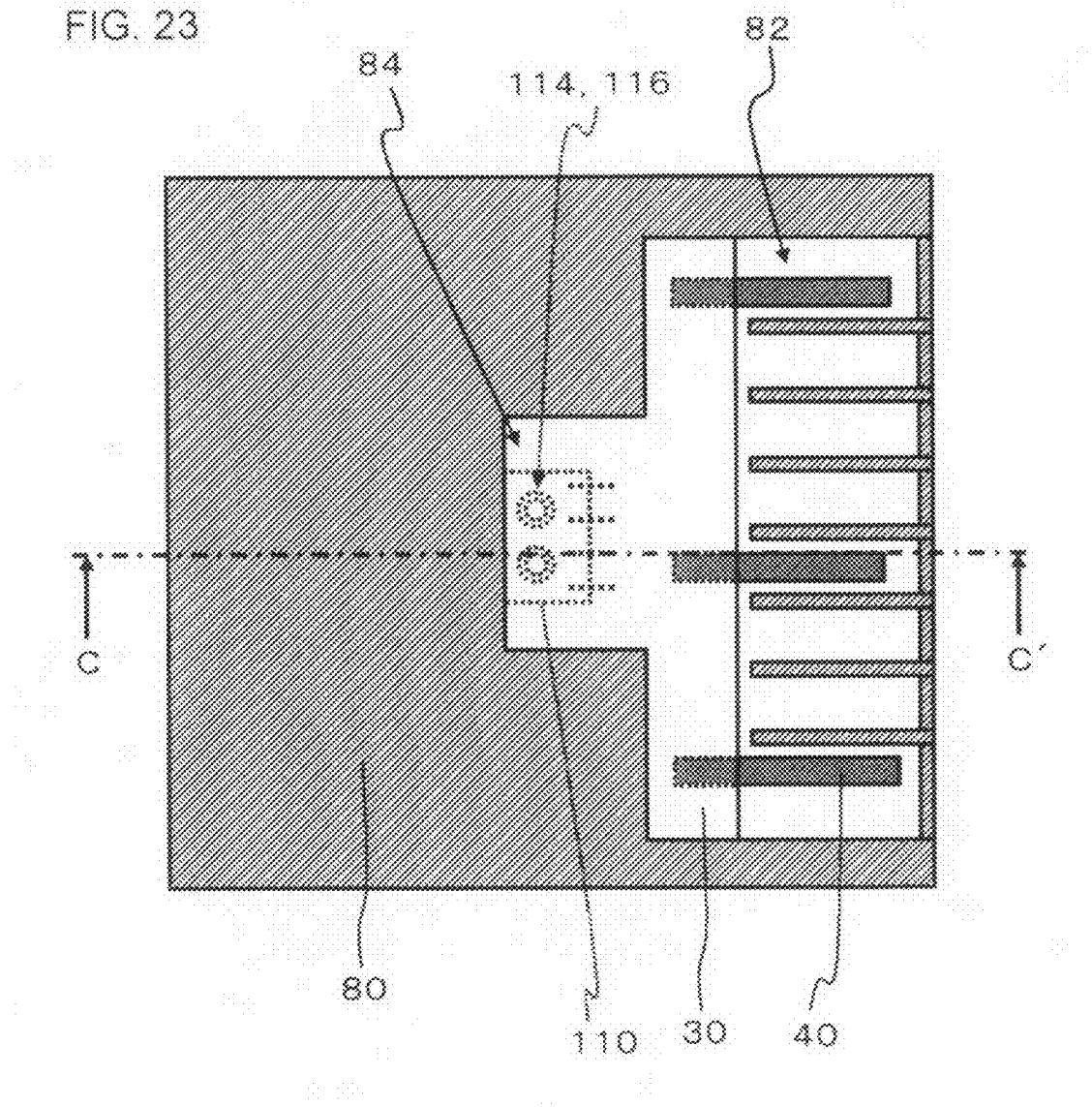
FIG. 23 is a plan view of the external storage device shown in FIG. 22.

FIG. 22 is a sectional view showing the configuration of an external storage device 10 according to an eleventh embodiment. FIG. 23 is a plan view of the external storage device 10 shown in FIG. 22. FIG. 22 is equivalent to a sectional view taken along the line C-C' of FIG. 23. The external storage device 10 shown in FIGS. 22 and 23 has the same configuration as the external storage device 10 according to the ninth embodiment except for the following points.

First, the external storage device 10 has a housing 80. The housing 80 covers the interconnect substrate 20 and the sealing resin layer 30. In addition, openings 82 and 84 are provided in the housing 80. The openings 82 and 84 are provided in a region facing the first surface of the interconnect substrate 20. When seen in a plan view, the opening 82 overlaps the external terminal 40 and the opening 84 overlaps the inductor 114.

In the example shown in FIG. 22, when seen from the insertion direction X of the external storage device 10, the external terminal 40, the semiconductor chip 110, and the semiconductor chip 120 are aligned in this order in the external storage device 10. In addition, the opening 82 extends to the tip of the external storage device 10 in the insertion direction X when seen in a plan view. Moreover, as shown in FIG. 23, the width of the opening 84 is smaller than that of the opening 82, and the opening 84 is connected to the opening 82.

Also in the present embodiment, the same effects as in the first embodiment can be achieved. In addition, since the interconnect substrate 20 and the sealing resin layer 30 are covered by the housing 80, durability of the external storage device 10 can be improved.

In addition, the opening 84 is provided at the position overlapping the inductor 114 in the housing 80. Accordingly, even if the housing 80 is provided, an increase in the distance from the inductor 114 to the inductor 514 of the reader 500 can be suppressed.

In addition, the opening 84 is connected to the opening 82. The opening 82 extends to the tip of the external storage device 10 in the insertion direction X when seen in a plan view. Accordingly, it is possible to prevent the interference between the housing 80 and the read section 510 of the reader 500 when inserting the external storage device 10 into the insertion hole 502 of the reader 500.

While the first to eleventh embodiments of the present invention have been described with reference to the drawings, these are only illustrative of the present invention, and other various configurations may also be adopted.

It is apparent that the present invention is not limited to the above embodiments, but may be modified and changed without departing from the scope and spirit of the invention.

What is claimed is:

1. An external storage device comprising:
   an interconnect substrate;
   at least one semiconductor chip disposed over a first surface of said interconnect substrate;
   a storage element provided in at least one of said at least one semiconductor chip;
   an inductor which is provided in at least one of said at least one semiconductor chip and which communicates information stored in said storage element to an outside;
   a driver circuit which is provided in at least one of said at least one semiconductor chip in order to drive said inductor;
   a contact type external terminal provided in said interconnect substrate; and
   a sealing resin layer which is formed over said first surface of said interconnect substrate and which seals said at least one semiconductor chip and does not cover said external terminal,
   wherein said inductor is formed at a surface of said semiconductor chip not facing said interconnect substrate, and
   wherein said sealing resin layer includes a recess in a region overlapping said inductor when seen in a plan view.

2. The external storage device according to claim 1, wherein said external terminal comprises a power supply terminal which supplies electric power to at least said driver circuit.

3. The external storage device according to claim 1, wherein a diameter of said inductor is equal to or less than 1 mm.

4. The external storage device according to claim 1, wherein said external storage device comprises a card type external storage device.

5. The external storage device according to claim 1, further comprising:
   a guide section which comprises an uneven section provided using said sealing resin layer.

6. The external storage device according to claim 5, wherein a planar shape of said external storage device is one of approximately rectangular and approximately square, and
   said guide section is formed at two opposite side surfaces of said external storage device.

7. The external storage device according to claim 1, wherein first and second semiconductor chips are provided as said at least one semiconductor chip,
   said first semiconductor chip includes said inductor and said driver circuit,
   said second semiconductor chip includes said storage element, and
   said first and second semiconductor chips are connected to each other through said interconnect substrate.

8. The external storage device according to claim 7, further comprising:
   a supporting member located between said first semiconductor chip and said first surface of said interconnect substrate,
   wherein said first semiconductor chip is disposed with an active surface, which includes said inductor and said driver circuit, opposite said first surface.

9. The external storage device according to claim 1, wherein said storage element comprises a nonvolatile storage element.

10. The external storage device according to claim 1, wherein said external terminal is provided at said first surface of said interconnect substrate.

11. The external storage device according to claim 1, wherein said external terminal is formed at a second surface of said interconnect substrate which comprises an opposite surface to said first surface.

12. The external storage device according to claim 1, further comprising:
   a penetrating hole for alignment formed in said interconnect substrate.

13. The external storage device according to claim 12, further comprising:
   a first protective insulating layer which covers said first surface of said interconnect substrate;
   a second protective insulating layer which covers said second surface of said interconnect substrate that comprises an opposite surface to said first surface;
   a first opening which is provided in said first protective insulating layer in order to expose said penetrating hole; and
   a second opening which is provided in said second protective insulating layer in order to expose said penetrating hole.

14. The external storage device according to claim 1, further comprising:
   a housing including said interconnect substrate and said sealing resin layer inside; and
   an opening which is provided in a region of said housing facing said first surface of said interconnect substrate,
   wherein said opening overlaps said external terminal and said inductor.

15. The external storage device of claim 1, wherein said inductor communicates said information via an electromagnetic wave that induces a current in a corresponding inductor of an external read device.

16. The external storage device of claim 1, wherein said inductor communicates said information without contact.

17. An external storage device comprising:
    an interconnect substrate;
    a contact type external terminal provided in said interconnect substrate; and
    at least one semiconductor chip disposed over a first surface of said interconnect substrate, wherein:
    at least one said semiconductor chip includes a storage element, at least one said semiconductor chip includes an inductor for communicating
    information stored in said storage element to an external read device, said communicating occurring via an electromagnetic wave, at least one said semiconductor chip includes a driver circuit to drive said inductor, a sealing resin layer is formed over said first surface of said interconnect substrate and which seals said at least one semiconductor chip but does not cover said external terminal, and said contact type external terminal serving to connect said driver circuit to a power source of said external read device, wherein said inductor is formed at a surface of said semiconductor chip not facing said interconnect substrate, and wherein said sealing resin layer includes a recess in a region overlapping said inductor when seen in a plan view.

18. An external storage device comprising:
an interconnect substrate;
at least one semiconductor chip disposed over a first surface of said interconnect substrate;
a storage element provided in at least one of said at least one semiconductor chip;
an inductor which is provided in at least one of said at least one semiconductor chip and which communicates information stored in said storage element to an outside;
a driver circuit which is provided in at least one of said at least one semiconductor chip in order to drive said inductor;
a contact type external terminal provided in said interconnect substrate; and
a sealing resin layer which is formed over said first surface of said interconnect substrate and which seals said at least one semiconductor chip and does not cover said external terminal, wherein said inductor is formed at a surface of said semiconductor chip not facing said interconnect substrate, wherein said sealing resin layer includes a recessed portion for aiding said communication of said information, and wherein said recessed portion includes a region overlapping said inductor.

19. A method of manufacturing an external storage device, said method comprising:

disposing at least one semiconductor chip over a first surface of an interconnect substrate having a contact type external terminal; and forming a sealing resin layer over said first surface of said interconnect substrate such that at least said at least one semiconductor chip is sealed and said external terminal is not covered, wherein a storage element is provided in at least one of said at least one semiconductor chip, wherein an inductor which communicates information stored in said storage element to the outside is provided in at least one of said at least one semiconductor chip, wherein a driver circuit of said inductor is provided in at least one of said at least one semiconductor chip, wherein said inductor is formed at a surface of said semiconductor chip not facing said interconnect substrate, and wherein said sealing resin layer includes a recess in a region overlapping said inductor when seen in a plan view.

* * * * *